United States Patent
Xia et al.

(10) Patent No.: US 10,461,199 B2
(45) Date of Patent: Oct. 29, 2019

(54) THIN FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Hui Xia, Guangdong (CN); Zhiwei Tan, Guangdong (CN); Shu Jhih Chen, Guangdong (CN)

(73) Assignee: SHENZHEN CHINA STAR OPTOELECTRONICS SEMICONDUTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/911,555

(22) Filed: Mar. 5, 2018

(65) Prior Publication Data
US 2019/0207030 A1 Jul. 4, 2019

Related U.S. Application Data

(63) Continuation of application No. PCT/CN2018/074060, filed on Jan. 24, 2018.

(30) Foreign Application Priority Data

Dec. 28, 2017 (CN) .......................... 2017 1 1458376

(51) Int. Cl.
*H01L 29/786* (2006.01)
*H01L 21/288* (2006.01)
(Continued)

(52) U.S. Cl.
CPC ........ *H01L 29/7869* (2013.01); *H01L 21/288* (2013.01); *H01L 21/76879* (2013.01); *H01L 29/66969* (2013.01); *H01L 27/1225* (2013.01)

(58) Field of Classification Search
CPC ............... H01L 27/1225; H01L 29/786; H01L 29/7869; H01L 21/283; H01L 21/288; H01L 21/2885; H01L 21/76879
See application file for complete search history.

(56) References Cited

U.S. PATENT DOCUMENTS 8,183,099 B2 * 5/2012 Sakata .............. H01L 21/02565
438/149
2006/0292777 A1 * 12/2006 Dunbar ............. H01L 21/02554
438/197

(Continued)

*Primary Examiner* — Ermias T Woldegeorgis
(74) *Attorney, Agent, or Firm* — Hemisphere Law, PLLC; Zhigang Ma

(57) ABSTRACT

The present disclosure discloses a manufacturing method of a thin film transistor, including: forming a gate layer on a substrate; forming a gate insulating layer on the gate layer and the substrate; forming an active layer on the gate insulating layer; and simultaneously forming a source and a drain formed on the active layer by a combination of a chemical plating method and a lift-off method. In the present disclosure, the chemical plating method is combined with the lift-off method, so that the wet-etching method is not used for forming the source and the drain, and thus the IGZO at the channel is not required to be protected by the etching-stop-layer. Therefore, while simplifying the production process, but also can reduce costs.

4 Claims, 3 Drawing Sheets

(51) Int. Cl.
*H01L 29/66* (2006.01)
*H01L 21/768* (2006.01)
*H01L 27/12* (2006.01)

(56) References Cited

U.S. PATENT DOCUMENTS

2015/0123120 A1* 5/2015 Yamazaki ............ H01L 29/7869
  257/43
2015/0228760 A1* 8/2015 Wei ....................... H01L 21/283
  257/66

* cited by examiner

THIN FILM TRANSISTOR AND MANUFACTURING METHOD THEREOF

RELATED APPLICATIONS

The present application is a National Phase of International Application Number PCT/CN2018/074060, filed Jan. 24, 2018, and claims the priority of China Application No. 201711458376.7, filed Dec. 28, 2017.

FIELD OF THE DISCLOSURE

The present disclosure relates to a semiconductor technology field, and more particularly to a thin film transistor and a manufacturing method thereof.

BACKGROUND OF THE DISCLOSURE

With the evolution of optoelectronics and semiconductor technology, it has also driven the flourishing development of Flat Panel Display. In many flat panel displays, thin film transistor liquid crystal displays (TFT-LCDs) have become the mainstream of the market due to their advantages of high space utilization efficiency, low power consumption, no radiation and low electromagnetic interference.

Oxide semiconductor materials, such as Indium Gallium Zinc Oxide (IGZO), are widely used in thin film transistor devices for the display industry due to their high mobility and on-state current. However, the process of the commonly used bottom-gate IGZO TFT is complicated and an etching-stop-layer (ESL) needs to be added in order to prevent the IGZO at the channel from being damaged when the source/drain metal electrode layer is wet-etched to affect device performance. However, the fabrication of the ESL increases the complexity of the fabrication process and is not conducive to cost reduction.

SUMMARY OF THE DISCLOSURE

In order to solve the technical problem existing in the prior art, an object of the present disclosure is to provide a thin film transistor capable of eliminating the need for the ESL and a method for manufacturing the thin film transistor.

According to an aspect of the present disclosure, there is provided a manufacturing method of a thin film transistor, including: forming a gate layer on a substrate; forming a gate insulating layer on the gate layer and the substrate; forming an active layer on the gate insulating layer; and simultaneously forming a source and a drain formed on the active layer by a combination of a chemical plating method and a lift-off method.

Further, the method of simultaneously forming a source and a drain formed on the active layer by a combination of a chemical plating method and a lift-off method includes: coating a photoresist layer on the gate insulating layer and the active layer; patterning the photoresist layer to remove a photoresist layer at the position where the source and the drain are to be formed to expose the active layer; using a chemical plating method to form a metal film layer on the remaining photoresist layer and the exposed portion of the active layer; and stripping the remaining photoresist layer with a stripping liquid to peel off the metal film layer on the remaining photoresist layer to form the source and the drain.

Further, before using a chemical plating method to form a metal film layer on the remaining photoresist layer and the exposed portion of the active layer, the manufacturing method further includes: doping the exposed portion of the active layer to form a first conductor portion and a second conductor portion; and disposing the source on the first conductor portion, and disposing the drain on the second conductor portion.

Further, the source includes a first bottom surface in contact with the first conductor portion, a first top surface opposite to the first bottom surface, and a first side surface connected between the first bottom surface and the first top surface, an included angle between the first side surface and the first bottom surface is less than or equal to 65°.

Further, the drain includes a second bottom surface in contact with the second conductor portion, a second top surface opposite to the second bottom surface, and a second side surface connected between the second bottom surface and the second top surface, an included angle between the second side surface and the second bottom surface is less than or equal to 65°.

According to another aspect of the present disclosure, there is also provided a thin film transistor, including: a substrate; a gate layer disposed on the substrate; a gate insulating layer disposed on the gate layer and the substrate; an active layer disposed on the gate insulating layer; a source and a drain, the source and the drain are simultaneously formed on the active layer by a combination of a chemical plating method and a lift-off method.

Further, the active layer includes a semiconductor portion and, a first conductor portion and a second conductor portion respectively located on both sides of the semiconductor portion, the source is disposed on the first conductor portion, and the drain is disposed on the second conductor portion.

Further, the source includes a first bottom surface in contact with the first conductor portion, a first top surface opposite to the first bottom surface, and a first side surface connected between the first bottom surface and the first top surface, an included angle between the first side surface and the first bottom surface is less than or equal to 65°.

Further, the drain includes a second bottom surface in contact with the second conductor portion, a second top surface opposite to the second bottom surface, and a second side surface connected between the second bottom surface and the second top surface, an included angle between the second side surface and the second bottom surface is less than or equal to 65°.

Further, the semiconductor portion is made of IGZO, the first conductor portion and the second conductor portion are made of IGZO doped with hydrogen.

The beneficial effects of the present disclosure are as follows: in the present disclosure, the source and the drain are formed by the chemical plating method in combination with the lift-off method, so that the wet-etching method is not used for forming the source and the drain, so that the IGZO at the channel is protected without making the ESL, which in turn simplifies the production process, but also can reduce costs.

BRIEF DESCRIPTION OF THE DRAWINGS

The above and other aspects, features and advantages of the embodiments of the present disclosure will become more apparent from the following description taken in conjunction with the accompanying drawings.

DETAILED DESCRIPTION OF PREFERRED EMBODIMENTS

Figure 1:
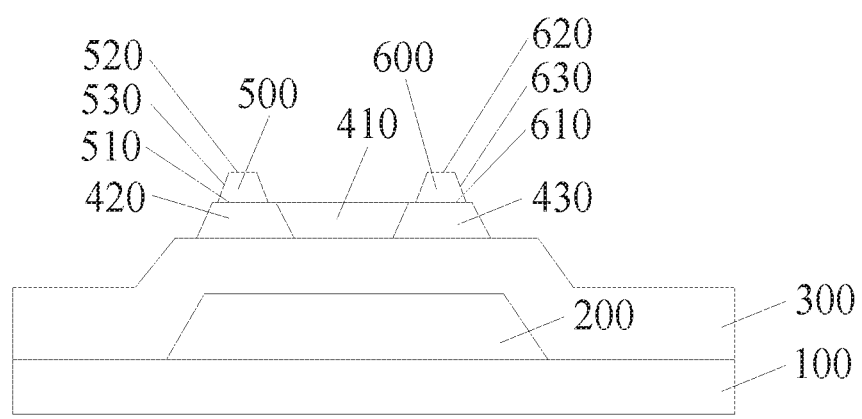
FIG. 1 is a schematic structural diagram of the thin film transistor according to the embodiment of the present disclosure.

Hereinafter, embodiments of the present disclosure will be described in detail with reference to the accompanying drawings. However, the disclosure may be embodied in many different forms and should not be construed as limited to the specific embodiments set forth herein. Rather, these embodiments are provided to explain the principles of the disclosure and its practical application to thereby enable those of ordinary skill in the art to understand various embodiments of the disclosure and various modifications as are suited to the particular use contemplated.

In the drawings, the thickness of layers and regions is exaggerated for clarity. The same reference numbers indicate the same elements throughout the specification and the drawings.

It will be understood that when an element such as a layer, a film, a region, or a substrate is referred to as being "on" another element, it can be directly on the other element or intervening elements may also be present. Alternatively, when an element is referred to as being "directly on" another element, there are no intervening elements present.

FIG. 1 is a schematic structural diagram of the thin film transistor according to the embodiment of the present disclosure.

Referring to FIG. 1, a thin film transistor according to an embodiment of the present disclosure includes a substrate 100, a gate layer 200, a gate insulating layer 300, an active layer 400, a source 500, and a drain 600.

Specifically, the gate layer 200 is disposed on the substrate 100. The gate insulating layer 300 is disposed on the gate layer 200 and the substrate 100; in other words, the gate insulating layer 300 completely covers the gate layer 200 and the substrate 100.

The active layer 400 is disposed on the gate insulating layer 300, and the active layer 400 is located above the gate layer 200. Further, the projection of the active layer 400 on the substrate 100 is located within the gate layer 200. The active layer 400 includes a semiconductor portion 410 and a first conductor portion 420 and a second conductor portion 430 respectively located at two sides of the semiconductor portion 410. In the present embodiment, the semiconductor portion 410 is made of IGZO, and the first conductor portion 420 and the second conductor portion 430 are obtained by hydrogen-conducting a doping process of the IGZO active layer.

The source 500 is disposed on the first conductor portion 420, and the drain 600 is disposed on the second conductor portion 430. Since the first conductor portion 420 and the second conductor portion 430 are obtained by H-doping a conductive layer of the IGZO active layer, both ends of the edge layer are made conductive, so that the bonding force between the source 500 and the first conductor portion 420 and the bonding force between the drain 600 and the second conductor portion 430 can be improved, and also reduce the contact resistance between the source 500 and the first conductor part 420 and the contact resistance between the drain 600 and the second conductor part 430. Therefore, as another embodiment of the present disclosure, the first conductor portion 420 and the second conductor portion 430 may not be formed.

In addition, the source 500 includes a first bottom surface 510 in contact with the first conductor portion 420, a first top surface 520 opposite to the first bottom surface 510, and a first side surface 530 connected between the first bottom surface 510 and the first top surface 520. The included angle between the first side surface 530 and the first bottom surface 510 is less than or equal to 65°.

Similarly, the drain 600 includes a second bottom surface 610 in contact with the first conductor portion 420, a second top surface 620 opposite to the second bottom surface 610, and a second side surface 630 connected between the second bottom surface 610 and the second top surface 620. The included angle between the second side surface 630 and the second bottom surface 610 is less than or equal to 65°.

Figure 2:
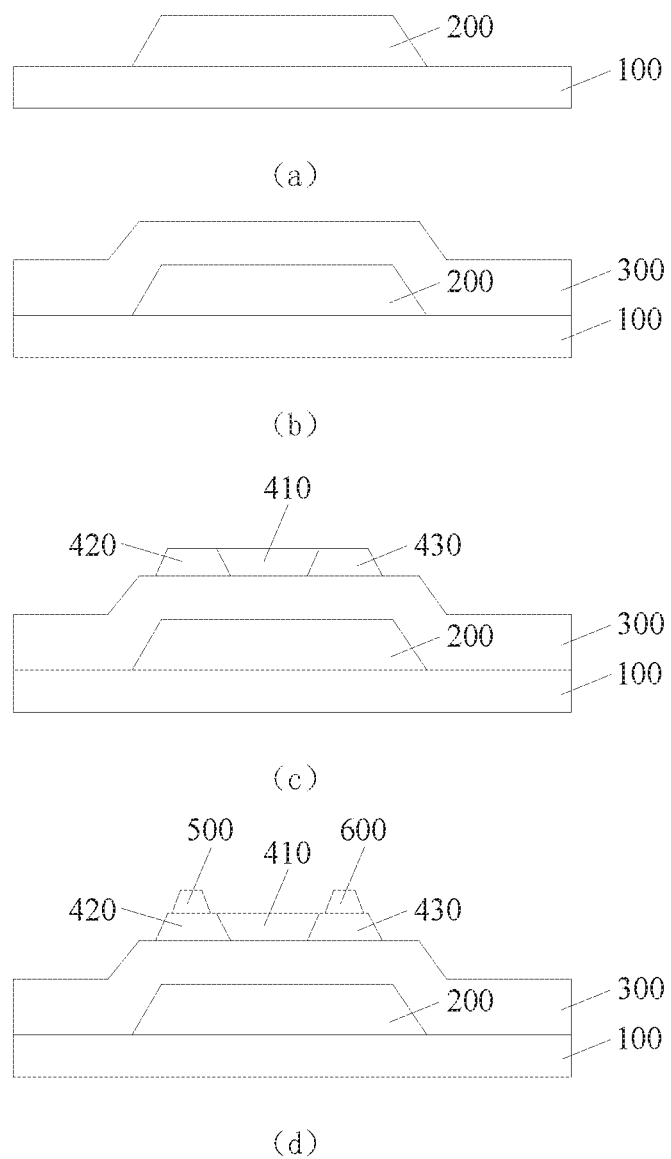
FIG. 2 is a process diagram of the thin film transistor according to the embodiment of the present disclosure.

The method of fabricating the thin film transistor according to the embodiment of the present disclosure will be described in detail below. FIG. 2 is a process diagram of a thin film transistor according to the embodiment of the present disclosure.

Step 1: Referring to FIG. 2 (a), forming a gate layer 200 on a substrate 100. The gate layer 200 is made of a stacked molybdenum layer and a copper layer, but the present disclosure is not limited thereto.

Step 2: Referring to FIG. 2 (b), forming a gate insulating layer 300 on the gate layer 200 and the substrate 100. The gate insulating layer 300 may be made of SiNx, SiOx, or SiNx/SiOx, but the present disclosure is not limited thereto.

Step 3: Referring to FIG. 2 (c), forming a semiconductor portion 410 and forming a first conductive portion 420 and a second conductive portion 430 on both sides of the semiconductor portion 410 respectively.

FIG. 3A to FIG. 3D are process diagrams of a semiconductor portion, a first conductor portion, and a second conductor portion according to the embodiment of the present disclosure.

Figure 3A:
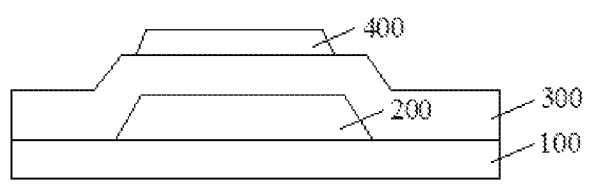
FIG. 3A to FIG. 3D are process diagrams of a semiconductor portion, a first conductor portion and a second conductor portion according to the embodiment of the present disclosure.

First, referring to FIG. 3A, forming an active layer 400 on the gate insulating layer 300 using IGZO.

Figure 3B:
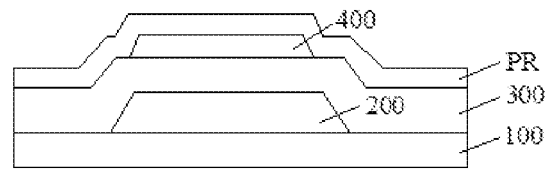

Next, referring to FIG. 3B, coating a photoresist layer PR on the gate insulating layer 300 and the active layer 400.

Figure 3C:
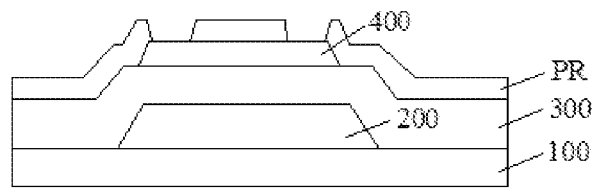

Next, referring to FIG. 3C, performing a patterning process to the photoresist layer (i.e., exposing, developing, and etching removal processes) to remove the photoresist layer PR at a position where the first conductor portion 420 and the second conductor portion 430 will be formed, thereby exposing portions of the active layer 400 that will form the first conductor portion 420 and the second conductor portion 430.

Figure 3D:
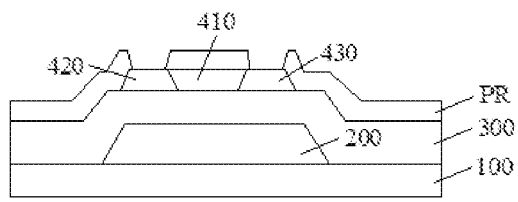

Finally, referring to FIG. 3D, doping the exposed portion of the active layer 400 with hydrogen gas to form the first conductor portion 420, the second conductor portion 430, and the semiconductor portion 410 between the first conductor portion 420 and the second conductor portion 430.

Step 4: Referring to FIG. 2 (d), forming a source 500 on the first conductor portion 420, and forming a drain 600 on the second conductor portion 430.

Figure 4A:
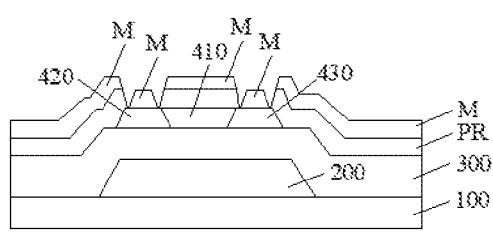
FIG. 4A and FIG. 4B are process diagrams of a semiconductor portion, a first conductor portion, and a second conductor portion according to the embodiment of the present disclosure.
Figure 4B:
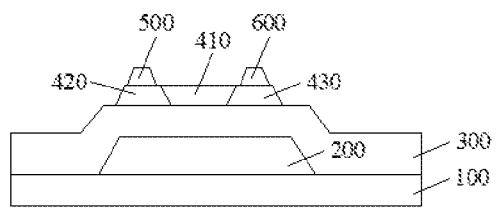

FIG. 4A and FIG. 4B are process diagrams of a semiconductor portion, a first conductor portion, and a second conductor portion according to the embodiment of the present disclosure.

First, referring to FIG. 4A, forming a metal film layer M on the remaining photoresist layer PR, the first conductor portion 420, and the second conductor portion 430 by a chemical plating method.

Next, referring to FIG. 4B, stripping the remaining photoresist layer PR with a stripping solution to peel off the metal film layer M on the remaining photoresist layer PR, so that the source 500 and the drain 600 are simultaneously formed on the first conductor portion 420 and the second conductor portion 430, respectively.

In the present embodiment, the metal film layer M can be made of, for example, copper, but the present disclosure is not limited thereto.

In addition, in the present embodiment, the lift-off method is combined with the chemical plating method so that the wet-etching method is not required for forming the source 500 and the drain 600, there is no need to make an ESL to protect the IGZO at the channel. Therefore, while simplifying the production process, but also can reduce costs.

Although the disclosure has been shown and described with reference to specific embodiments, those skilled in the art will understand that: various changes in form and detail may be made therein without departing from the spirit and scope of the disclosure as defined by the appended claims and their equivalents.

What is claimed is:

1. A thin film transistor manufacturing method, comprising:
    forming a gate layer on a substrate;
    forming a gate insulating layer on the gate layer and the substrate;
    forming an active layer on the gate insulating layer; and
    simultaneously forming a source and a drain formed on the active layer by a combination of a chemical plating method and a lift-off method;
    wherein the simultaneously forming a source and a drain formed on the active layer by a combination of a chemical plating method and a lift-off method comprises:
    coating a photoresist layer on the gate insulating layer and the active layer;
    patterning the photoresist layer to remove a photoresist layer at a position where the source and the drain are to be formed to expose the active layer;
    doping the exposed portion of the active layer to form a first conductor portion and a second conductor portion; and disposing the source on the first conductor portion, and disposing the drain on the second conductor portion;
    using a chemical plating method to form a metal film layer on a remaining photoresist layer and an exposed portion of the active layer; and
    stripping the remaining photoresist layer with a stripping liquid to peel off the metal film layer on the remaining photoresist layer to form the source and the drain.

2. The thin film transistor manufacturing method according to claim 1, wherein the source comprises a first bottom surface in contact with the first conductor portion, a first top surface opposite to the first bottom surface, and a first side surface connected between the first bottom surface and the first top surface, an included angle between the first side surface and the first bottom surface is less than or equal to 65°.

3. The thin film transistor manufacturing method according to claim 2, wherein the drain comprises a second bottom surface in contact with the second conductor portion, a second top surface opposite to the second bottom surface, and a second side surface connected between the second bottom surface and the second top surface, an included angle between the second side surface and the second bottom surface is less than or equal to 65°.

4. The thin film transistor manufacturing method according to claim 1, wherein the drain comprises a second bottom surface in contact with the second conductor portion, a second top surface opposite to the second bottom surface, and a second side surface connected between the second bottom surface and the second top surface, an included angle between the second side surface and the second bottom surface is less than or equal to 65°.

* * * * *